(12) United States Patent
Jongman et al.

(10) Patent No.: US 6,801,000 B2
(45) Date of Patent: Oct. 5, 2004

(54) LIGHT-EMITTING DEVICES

(75) Inventors: Jan Jongman, Cambridge (GB); John Altrip, Cambridge (GB); David Lacey, Penang (MY)

(73) Assignee: Cambridge Display Technology Ltd., Cambridgeshire (GB)

( * ) Notice: Subject to any disclaimer, the term of this patent is extended or adjusted under 35 U.S.C. 154(b) by 0 days.

(21) Appl. No.: 10/276,108

(22) PCT Filed: Jun. 21, 2001

(86) PCT No.: PCT/GB01/02732

§ 371 (c)(1),
(2), (4) Date: Jun. 18, 2003

(87) PCT Pub. No.: WO01/99195

PCT Pub. Date: Dec. 27, 2001

(65) Prior Publication Data

US 2004/0021423 A1 Feb. 5, 2004

(30) Foreign Application Priority Data

Jun. 23, 2000 (GB) .............................................. 0015327
Sep. 19, 2000 (GB) .............................................. 0022937

(51) Int. Cl.$^7$ ................................................ G09G 3/10
(52) U.S. Cl. .................................... 315/169.1; 257/103
(58) Field of Search ............................ 315/169.1, 169.3; 349/69, 144

(56) References Cited

U.S. PATENT DOCUMENTS 5,646,702 A * 7/1997 Akinwande et al. ........... 349/69
5,812,105 A * 9/1998 Van de Ven ................... 345/83
6,359,292 B1 * 3/2002 Sugawara et al. .......... 257/103

FOREIGN PATENT DOCUMENTS

| EP | 1024399 | 8/2000 |
| GB | 2 344 691 | 6/2000 |
| JP | 10-039791 | 2/1998 |
| JP | 11-111457 | 4/1999 |
| JP | 11-162233 | 6/1999 |
| JP | 2000-235891 | 8/2000 |
| WO | 98/59382 | 12/1998 |
| WO | 99/03158 | 1/1999 |
| WO | 99/42983 | 8/1999 |

OTHER PUBLICATIONS

International Search Report—PCT/GB01/02732; ISA/EPO, Aug. 10, 2001.

UK Patent Office Search Report—GB 0015327.0; Jan. 3, 2001.

* cited by examiner

Primary Examiner—Don Wong
Assistant Examiner—Chuc Tran
(74) Attorney, Agent, or Firm—Harness, Dickey & Pierce, P.L.C.

(57) ABSTRACT

A light-emitting device comprising: a first electroluminescent element for emitting light of a first colour when energised; and a second electroluminescent element for emitting light of a second colour when energised, the first electroluminescent element having an active lifetime which is greater than that of the second electroluminescent element; characterised in that the second element is configured to operate at a lower brightness than the first element.

19 Claims, 7 Drawing Sheets

LIGHT-EMITTING DEVICES

DESCRIPTION

BACKGROUND OF THE INVENTION

The present invention relates to a light-emitting device, particularly an electroluminescent device and displays incorporating such devices. The electroluminescence for the electroluminescent device may be provided by means of an organic light-emissive material (see for example International Publication WO90/13148 which describes electroluminescent semi-conductive conjugated polymers, such as PPV).

By way of background, FIG. 1 shows the typical cross-sectional structure of an organic light-emissive device. The device is fabricated on a substrate (1) coated with a transparent first electrode (2) such as indium-tin-oxide. The coated substrate is overcoated with at least one layer of a thin film of an electroluminescent organic material (3) and a final layer forming a second electrode (4) which is typically of metal. By using a transparent substrate (e.g. of glass or plastics material), light generated in the film (3) is able to leave the device by passing through the first electrode (2).

The performance of electroluminescent devices has advanced rapidly over the past few years. Due to their high efficiencies, the devices show potential for a wide range of display applications, from simple backlights to graphic displays, such as television screens, computer monitors and palm-top devices which may consist of several million pixels. However, there is considerable variation in the active lifetimes of red, green and blue organic electroluminescent systems, including polymer systems. For the purposes of the present specification, the active lifetime of an electroluminescent element is defined as the maximum time for which the element is able to produce at least a display-monitor level of brightness (for example, set at 100 cd/m$^2$) when operating under a given drive scheme. For example, an electroluminescent device with a red light emitting polymer may have an active life of 30,000 hours at 5 volts, whereas a device with a blue light-emitting polymer may have an active life of only 1500 hours at the same voltage (see table 1).

The disparity in active lifetimes of organic light-emissive materials is significant because one factor in determining the useful life or service life of a graphic display incorporating such materials is governed by the shortest of the active lifetimes of the different polymers employed. (Another factor concerns decay rates causing colour shift, which can reduce overall colour purity, i.e. 'white' becomes 'off-white', and possibly also produce non-uniformity in the display). Accordingly, attempts have been made to improve the service life of graphic displays. For example, research has been conducted into upgrading the active lifetime of the 'weak link' in such displays; namely, the relatively short-lived blue light-emitting polymers. Also, systems have been devised to compensate the device driving current—either by using a sensing mechanism or by predicting the rate of performance decay in complex drive compensation electronics—to maintain optimal performance with time. However, compensation mechanisms require complex and expensive circuitry which may also impose restrictions on the available aperture ratio.

SUMMARY OF THE INVENTION

An object of the present invention is to improve the service life of graphic displays incorporating organic light-emissive materials.

In accordance with a first aspect of the present invention, there is provided a light-emitting device comprising: a first electroluminescent element for emitting light of a first colour when energised; and a second electroluminescent element for emitting light of a second colour when energised, the first electroluminescent element having an active lifetime which is greater than that of the second electroluminescent element, characterised in that the second element is configured to operate at a lower brightness than the first element.

The brightness or luminescence of light emitted by an object may be measured in candela per square meter, and is a measure of the amount of light (number of photons) emitted per second per unit solid angle per unit area, as corrected for the sensitivity of the eye. The instantaneous brightness may vary—intentionally or otherwise—from one moment to another. When considering light-emitting devices for use in graphic displays, variations in instantaneous brightness may occur too rapidly to be detected by the human eye. Accordingly, the "brightness" which is of interest to the present invention is time-averaged to the extent necessary to smooth out localised or high speed variations in instantaneous brightness.

The first and second electroluminescent elements may comprise organic light emissive materials, and may be polymeric materials such as those discussed in WO90/13148 or WO92/03490.

The present applicant has appreciated the implication of the correlation between brightness and service life of devices employing organic light-emissive materials. The correlation is illustrated schematically in FIG. 2 for two electroluminescent elements employing different organic light-emissive materials, for example a red light emitter (R) and a blue light emitter (B) which have different active lifetimes. The correlation for each may be summarised as a relatively high brightness being indicative of a relatively short service life and vice versa. If both organic light-emissive materials are operated continuously at the same level of brightness, the material with the shortest active lifetime will fail (i.e. reach the end of its active life) first (in the example, the blue will fail before the red) and the device will be judged to have failed prematurely at $t_1$. However if the material with the shortest active lifetime is operated continuously at a lower level of brightness than the other material, the service life of the device will be extended to $t_2$.

The ratio between the brightness ($B_1$) of the first electroluminescent element and the brightness ($B_2$) of the second electroluminescent element may be substantially equal to the ratio between the active lifetime ($\tau_1$) of the first element and the active lifetime ($\tau_2$) of the second element (i.e. $B_1/B_2 = \tau_1/\tau_2$) Suppose, for example, that there is an order of magnitude difference in the active lifetime of the two elements (e.g. active lifetime of the first element is 30,000 hrs and the active lifetime of the second element is 3,000 hrs). If the two elements are to fail at substantially the same time, it may be necessary to operate the second element at one tenth of the brightness of the first element.

There may be another advantage to operating the second element (shorter active lifetime) at a lower brightness than the first element. When operated continuously, the amount of light emitted per unit time by the first and, second elements may decrease or decay with time, with the rate of decay perhaps being greater for the second element. Thus, the perceived colour of the light-emitting device with both elements energised will drift with time because the contribution by the second element to the overall light output slowly decreases. However, by operating the second element at a lower brightness than the second element may have the effect of retarding the rate of decay in the amount of light emitted per unit time. In other words, the rates of decay in the amount of light emitted per unit time by the first and second elements may become more even. Hence, the problem of perceived colour drift with time may be alleviated.

The first and second electroluminescent elements may be energised by a common potential difference, for example by using a common cathode. The correlation between brightness (or luminance in cd/m$^2$) and voltage is illustrated schematically in FIG. 3 for two electroluminescent elements employing different materials, for example a red light emitter (RED) and a blue light emitter (BLUE) which have different driving voltage characteristics. In fact, the red light emitter (RED) has a lower driving voltage characteristic than the blue light emitter (BLUE). Thus, by driving the two elements at a common potential ($V_1$), the red light emitter will be operating at a higher brightness than the blue light emitter ($B_1 > B_2$). Accordingly, the goal of extending the service life of the device is attainable by operating at a common potential.

In an alternative embodiment, the first and second elements may be energised by different potentials. The second element may be energised at a higher potential than the first element. Referring to FIG. 3, driving the blue light emitter (BLUE) at $V_2$ will yield a brightness $B_3$ which is greater than $B_2$. Of course, if performance characteristics were reversed in FIG. 3 or the RED and BLUE curves cross over in the drive potential regime, the first element may be energised at a higher potential than the second element.

The second element may be energised in pulses. Pulsing has the effect of lowering the time-averaged brightness as compared to operating continuously, e.g. at a constant potential. Thus, even though the blue light emitter (BLUE) is operating at a higher potential than before ($V_2 > V_1$), the service life of the device may still be greater than $t_1$ because the emitter is only energised for a fraction (e.g. less than 1/10) of the overall time. The second element may be pulsed at a frequency in excess of 50 Hz, and perhaps at 100 Hz. Although lower frequencies would also have the effect of lowering the time-averaged brightness, it may be desirable in some applications to pulse at a rate which is faster than the eye response function. Each pulse may last for perhaps 200 microseconds, with perhaps 20 milliseconds between pulses.

The first and second elements may be pulsed, with the time-averaged brightness for the first element being greater than that for the second element. Thus, if the first and second elements are operating at a common potential, the first element may be energised for longer periods that the second element. This may be achieved by pulsing the first element more frequently than the second element or by increasing the duration of each pulse (pulse width) for the first element relative to that for the second element. Pulsing of both elements may be useful for light-emitting devices incorporated in passive matrix-driven displays.

The second element may be adapted to emit light over a larger area than the first element. The difference in light-emitting areas may be such that the total light output from the first element is substantially equal to that from the second element over a comparable time frame. For example, if there is no difference in duration of activation, the ratio between the light-emitting area ($A_1$) of the first element and the light-emitting area ($A_2$) of the second element may be substantially equal to the ratio between the brightness ($B_2$) of the second element and the brightness ($B_1$) of the first element (i.e. $A_1/A_2 \approx B_2/B_1$). By operating the second element at a lower time-averaged brightness than the first element, the amount of light observed by an observer from the elements will differ if the elements are of equal size (assuming the duration of activation is equal). This is because with normal eye constraints (e.g. sampling and resolution factors) the amount of light received from an element is related to the product of the time-averaged brightness and the area over which light is emitted. However, by increasing the size of the second element relative to the first element, such a difference may be offset somewhat or even totally compensated.

The brightnesses of the first and second electroluminescent elements may be chosen such that the half-lives of the first and second electroluminescent elements are substantially equal.

The choice of driving conditions for the two electroluminescent elements may be governed by material properties. FIG. 4 shows a plot of efficiency against current density for red and blue light-emissive polymers in the first and second electroluminescent elements, respectively. If the device is to operate at optimum efficiency, the first electroluminescent element will need to operate at a first current density $\sigma_1$, whilst the second electroluminescent element will need to operate at a second current density $\sigma_2$, with $\sigma_1 > \sigma_2$. The current density $\sigma_2$ may, for example, be achieved by operating the second element at a higher potential than the first element, and achieve a lower brightness by pulsing the second element.

The device may further comprise a third electroluminescent element for emitting light of a third colour when energised, the third electroluminescent element having an active lifetime in between that of the first and second electroluminescent elements. All elements may comprise organic light-emissive materials, and may be polymeric materials such as those disclosed in WO90/13148 or WO92/03490. All elements may be energised by a common potential difference, or at different potentials, perhaps with the second element at the highest potential and the first element at the lowest, and perhaps with the second element being pulsed.

The third element may be adapted to emit light over an area which is greater than the first element but smaller than the second element. The reason for doing this is again to achieve the desired total light output per unit time. The effect of doing this is the same as increasing the service life of the second element at the expense of the first element. This is because in practice, when dealing with a finite substrate, the light-emitting area of the third element will be normalised and the areas of the first and second elements will be relatively smaller and larger respectively.

There is also provided a graphic display incorporating a light-emitting device according to the first aspect of the invention, wherein each electroluminescent element in the device corresponds to a pixel for displaying graphic information.

In accordance with a second aspect of the present invention, there is provided a light-emitting device comprising: a first electroluminescent element for emitting light of a first brightness ($B_1$) when energised by a predetermined potential; and a second electroluminescent element for emitting light of a second brightness ($B_2$) when energised by the predetermined potential, the second brightness being less than the first brightness; characterised by means for energising the first and second electroluminescent elements at the predetermined potential, and in that the second electroluminescent element has a larger light-emitting area than the first electroluminescent element.

The second aspect of the present invention provides for increasing the light-emitting area of the element with the lowest brightness relative to that of the element with the highest brightness, with a view to reducing the difference in the total light emitted by the elements in unit time. In the absence of such an areal compensation, the brightest element (i.e. the first electroluminescent element) will emit more light than the other element when operating at a common potential.

The first or second electroluminescent element may comprise an organic light-emissive material. The organic light-emissive material may be polymeric.

The energising means may comprise at least one electrode common to both electroluminescent elements. For example, the energising means may comprise an anode and a cathode, each common to both electroluminescent elements.

The total light emitted by the first electroluminescent element may be substantially equal to the total light emitted by the second electroluminescent element in any given time interval when both electroluminescent elements are energised. The ratio of the first brightness ($B_1$) to the second brightness ($B_2$) may be substantially equal to the ratio of the light-emitting area of the second electroluminescent element ($A_2$) to the light-emitting area of the first electroluminescent element ($A_1$), i.e. $B_1/B_2 \approx A_2/A_1$.

The first and second electroluminescent elements may emit light of first and second colours respectively when energised, the first and second colours being selected from the group consisting of red, green and blue.

The light-emitting device may further comprise: a third electroluminescent element for emitting light of a third brightness when energised by the predetermined potential, the third brightness being in between that of the first and second brightness; and means for energising the third electroluminescent element at the predetermined potential. The third electroluminescent element may have a light-emitting area greater than that of the first element and less than that of the second element.

There may be provided a graphic display comprising a light-emitting device according to the second aspect of the invention, wherein each electroluminescent element corresponds to a pixel for displaying graphic information.

In accordance with a third aspect of the invention, there is provided a light-emitting device comprising: a first electroluminescent element for emitting light of a first colour when energized; and a second electroluminescent element for emitting light of a second colour when energized, the first electroluminescent element emitting light at a lower luminance than that of the second electroluminescent element when each is energized with optimal efficiency; characterized in that the first and second electroluminescent elements are configured to operate at the same perceived brightness when both electroluminescent elements are energized with optimal efficiency.

The third aspect of the invention provides for operating light emitting elements—having different luminance versus efficiency characteristics—at optimal efficiency whilst at the same time achieving uniformity in the light output from each element. Such a light emitting device may be valuable where lifetime is not an issue, which may well be the case in certain "throwaway" applications.

The first or second electroluminescent elements may comprise an organic light-emissive material. The organic light-emissive material may be polymeric. The first and second electroluminescent elements may be energized by a common potential.

The first and second electroluminescent elements may be energized by different potentials, and the second electroluminescent element may be energized at a higher potential than the first electroluminescent element. The energizing potential applied to one or both of the electroluminescent elements may be pulsed, with the first electroluminescent element perhaps being energized for longer periods than the second electroluminescent element. For example, the first electroluminescent element may be pulsed more frequently or with a greater pulse width than the second electroluminescent element.

The first electroluminescent element may be configured to emit light over a larger area than the second electroluminescent element. The ratio between the light emitting areas of the first and second electroluminescent elements ($A_1$ and $A_2$) may be substantially equal to the ratio between the luminances of the second and first electroluminescent elements ($L_2$ and $L_1$) respectively when energized at optimal efficiency, i.e., $A_1/A_2 \; L_2/L_1$.

The first and second colours of light emitted from the electroluminescent elements are selected from the group consisting of red, green and blue. The device may further comprise a third electroluminescent element for emitting light of a third colour when energized, the third electroluminescent element emitting light at a luminance in between that of the first and second electroluminescent elements when energized with optimal efficiency.

There may also be provided a graphic display comprising a light-emitting device according to the third aspect of the invention, wherein each electroluminescent element corresponds to a pixel for displaying graphic information.

In accordance with a fourth aspect of the invention, there is provided a light-emitting device comprising: a first electroluminescent element for emitting light of a first colour when energized; and a second electroluminescent element for emitting light of a second colour when energized, the first electroluminescent element having a half-life which is greater than that of the second electroluminescent element when each is energized with optimal efficiency; characterized in that the second electroluminescent element is configured to operate at a lower brightness than the first electroluminescent element when both are energized with optimal efficiency.

The third aspect of the invention provides for operating light-emitting elements—having different half-life versus efficiency characteristics—at optimal efficiency and in such a way that the service life of the device is increased.

The first or second electroluminescent elements may comprise an organic light-emissive material. The organic light-emissive material may be polymeric. The first and second electroluminescent elements may be energized by a common potential.

The first and second electroluminescent elements may be energized by different potentials, and the second electroluminescent element may be energized at a higher potential than the first electroluminescent element. The energizing potential applied to one or both of the electroluminescent elements may be pulsed with the first electroluminescent element perhaps being energized for longer periods than the second electroluminescent element. For example, the second electroluminescent element may only be energized for short periods whilst the first electroluminescent element is operated continuously. The ratio between the energization times for the first and second electroluminescent elements ($t_1$ and $t_2$) may be substantially equal to the ratio between the half-lives of the second and first electroluminescent elements ($T_2$ and $T_1$) respectively when energized at optimal efficiency, i.e. $t_1/t_2 \approx T_2/T_1$.

The first electroluminescent element may be configured to emit light over a larger area than the second electroluminescent element. The ratio between the light emitting areas of the first and second electroluminescent elements ($A_1$ and $A_2$) may be substantially equal to the ratio between the brightnesses of the second and first electroluminescent elements ($B_2$ and $B_1$) respectively when energized at optimal efficiency, i.e., $A_1/A_2$ $B_2/B_1$.

The first and second colours of light emitted from the electroluminescent elements are selected from the group consisting of red, green and blue. The device may further comprise a third electroluminescent element for emitting light of a third colour when energized, the third electroluminescent element emitting light at a luminance in between that of the first and second electroluminescent elements when energized with optimal efficiency.

There may also be provided a graphic display comprising a light-emitting device according to the third aspect of the invention, wherein each electroluminescent element corresponds to a pixel for displaying graphic information.

BRIEF DESCRIPTION OF THE DRAWING

An embodiment of the invention will now be described by way of example with reference to the accompanying drawings in which.

DESCRIPTION OF THE EMBODIMENTS

The perceived brightness of a display depends on the following parameters:

$$\text{Luminance}_{perceived} = \text{Luminance}_{pixel} \cdot \text{Area\_ratio}_{pixel} \cdot \text{Pulse\_width\_ratio}$$

In this equation the Luminance$_{perceived}$ is the luminance seen by the eye assuming that the pixel size is below the eye resolution limit and the pulse repetition rate is faster than the eye response. The luminance of a pixel depends on:

$$\text{Luminance}_{pixel} = f[(\text{Efficiency}_{pixel} \text{ (time\_total, } V_{pixel} \text{ or } I_{pixel}))]$$

Accordingly, the perceived luminance depends on:
1. Pixel area ratios
2. Pixel pulse width ratio
3. Pixel efficiency
4. Pixel half-life, or how the efficiency is changing with time
5. The current or voltage supplied to the pixel, i.e. drive conditions.

Of these five parameters, the efficiency and half-life are defined by the device/material properties and cannot be altered. The other parameters however can be altered. The pixel area ratio can be modified for a display, but cannot be changed during operation. For a certain device construction a common cathode and anode could be chosen, this will lead to an identical voltage across pixels with different colours. The pulse width ratio can be changed during operation by the driver circuit. In Table 2, an overview is given how the perceived luminance, display life time, display efficiency and common voltage can be optimised towards area ratio and pulse width.

In theory, therefore, there are five different optimised operational regimes which may be summarised as:

1.1 Equal (perceived) luminance, different voltage, different efficiency, equal half-life;
1.2 Equal (perceived) luminance, equal voltage, different efficiency, different half-life;
1.3 Equal (perceived) luminance, different voltage, optimal efficiency, different half-life;
1.4 Different (perceived) luminance, equal voltage, different efficiency, equal half-life; and
1.5 Different (perceived) luminance, different voltage, optimal efficiency, equal half-life.

1.1 Equal Luminance, Different Voltage, Different Efficiency, Equal Half-life

Figure 5:
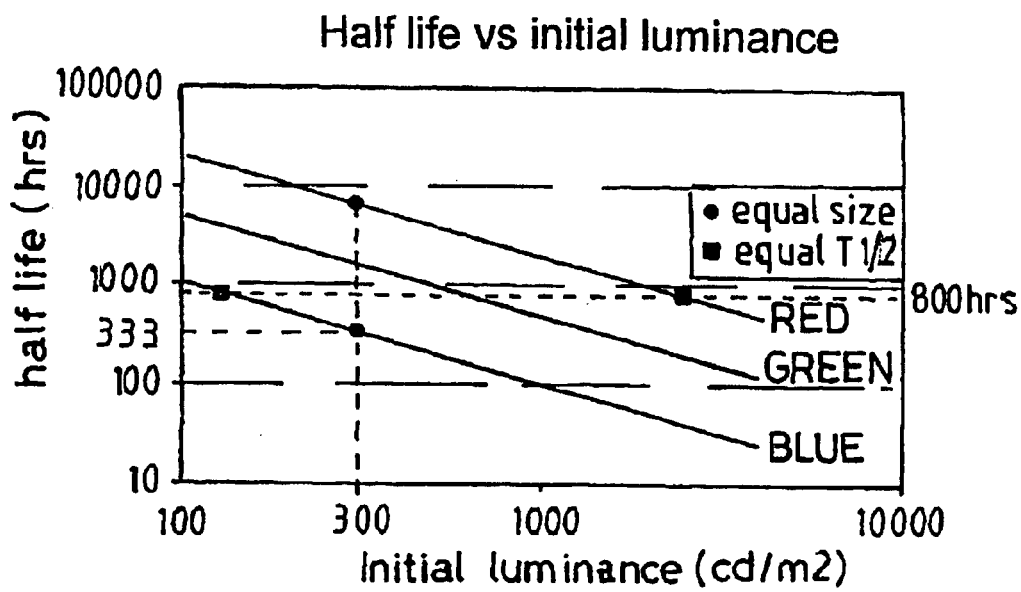
FIG. 5 is a graph showing pixel half-life as a function of pixel luminance for the colours red, green and blue.

For an ideal three-colour display all the display area can be used for the pixels. In a standard display, all the pixels have the same area and therefore ⅓ of the display area is available for each colour. If a display should have a luminance for each colour of e.g., 100 cd/M$^2$, a pixel luminance of 300 cd/m$^2$ per pixel is required. In the example of FIG. 5, the display lifetime is controlled by the lowest half-life and is in this example 333 hrs. The overall display lifetime can be increased, say to 800 hrs, by optimising the pixels' areas. [In the example of FIG. 5, it is assumed that the initial luminance multiplied with the half-life is constant]. However, the optimisation can also be done for other relationships. In order for the perceived luminance to be 100 cd/m$^2$/(pixel area ratio). From FIG. 5, the luminance values needed for the blue green and red pixels are 125, 625 and 2500 cd/m$^2$ in order to obtain identical half-lives. Therefore the relative pixel area ratios are A(blue):A(green):A(red)= 100/125 :100/625:100/2500 i.e., 0.8:0.16:0.04 instead of 1/3:1/3:1/3.

1.2. Equal Luminance, Equal Voltage, Different Efficiency, Different Half-life.

Figure 6:
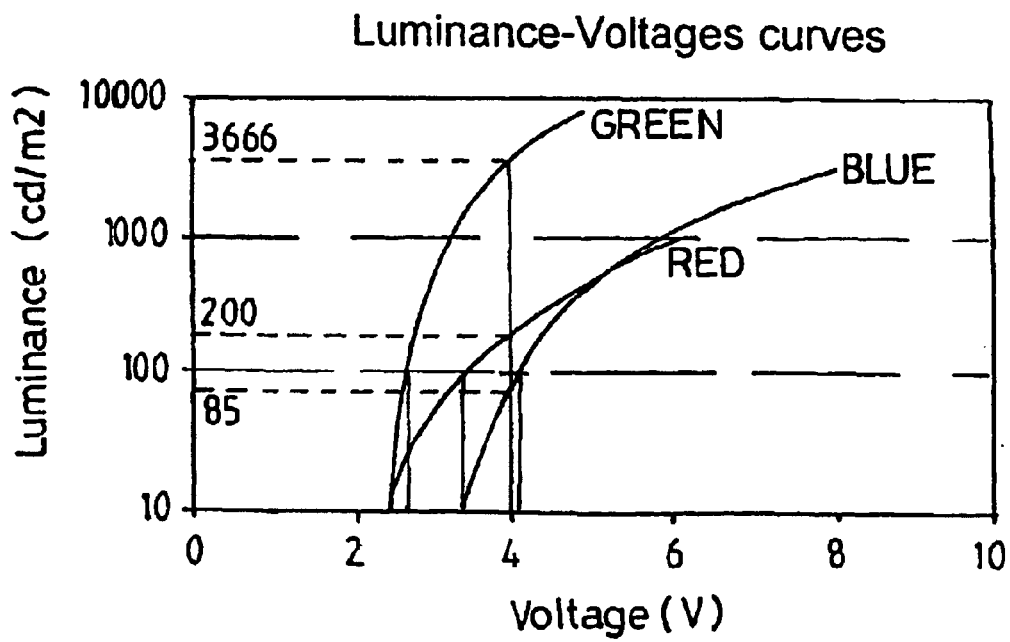
FIG. 6 is a graph showing luminance versus voltage curves for red, green and blue light emitting polymer pixels.

In some display applications, a common pixel voltage might be needed for instance in the case of a common anode and cathode e.g., to produce a cheap white backlight. Suppose, for example, luminance voltage curves are as shown in FIG. 6. By driving all the pixels at an identical voltage of 4V, each different coloured pixel will have a different luminance. In order to obtain uniform perceived luminance three options are available:

1. Optimise Relative Pixel Areas.

The relative pixel areas can now be optimised for the perceived brightness to be identical for each colour.

$$Lum_{perceived} = Lum_{pixel} \cdot Relative\_pixel\_area$$

For a uniform perceived luminance the relative pixels areas should be A(blue):A(green):A(red)=1/85:1/200:1/3666=0.691:0.293:0.016 (since sum of area ratios must equal unity) resulting in a 58.7 cd/M² perceived luminance for each colour. The disadvantage of this solution is, that for each required display luminance another pixel area ratio is required. The next solution overcomes this problem.

2. Optimise Pixel Driving Time.

The luminance of a pixel can also be controlled by adjusting the driving pulse width of a pixel. The ratio of the pulse width for the blue, green and red pixel are identical to point 1. This solution has the advantage, that the pulse width can be adjusted if another display luminance is required.

3. Optimise Both Driving Time and Pixel Area.

Both solutions mentioned above can be combined. Choose an appropriate pixel area ratio resulting in very similar pulse width. This avoids the need of high frequency pulses, which can result in worse performance and higher driver IC design and fabrication costs.

1.3. Equal Luminance, Different Voltage, Optimal Efficiency, Different Half-life.

Figure 7:
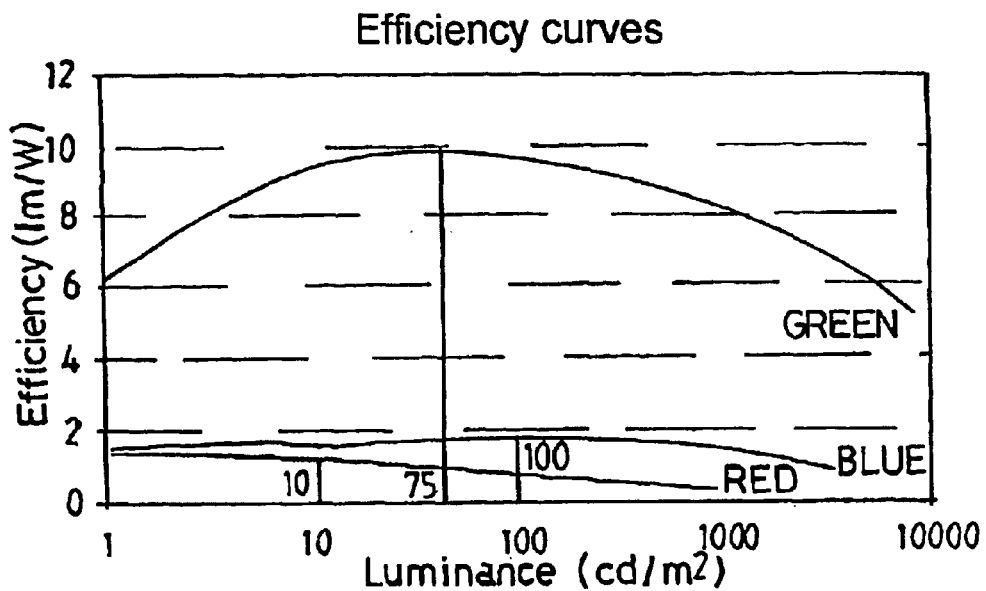
FIG. 7 is a graph showing efficiency versus luminance for the colours red, green and blue.

The display can also be optimised towards equal luminance and optimal efficiency per colour. In this example, the power losses due to pulsed driving are neglected. As can be seen from FIG. 7 each colour has an optimal efficiency at a different luminance. The perceived luminance may be made equal by adjusting the ratio of pixel areas and/or the pulse widths.

1. Optimise Relative Pixel Areas

In order for the perceived brightnesses to be equal, the pixel area ratios should be the inverse of the luminance ratios or A(blue):A(green):A(red)=1/100:1/75 :1/10= 0.081:0.108:0.811. This will lead to a perceived luminance of 8.1 cd/m². Lower luminance values can be achieved at optimal efficiency by changing the pulse width, although AC driving results in extra power loss. The optimal efficiency cannot be achieved for higher luminance values.

1.4 Different Luminance, Equal Voltage, Different Efficiency, Equal Life-time.

Figure 8:
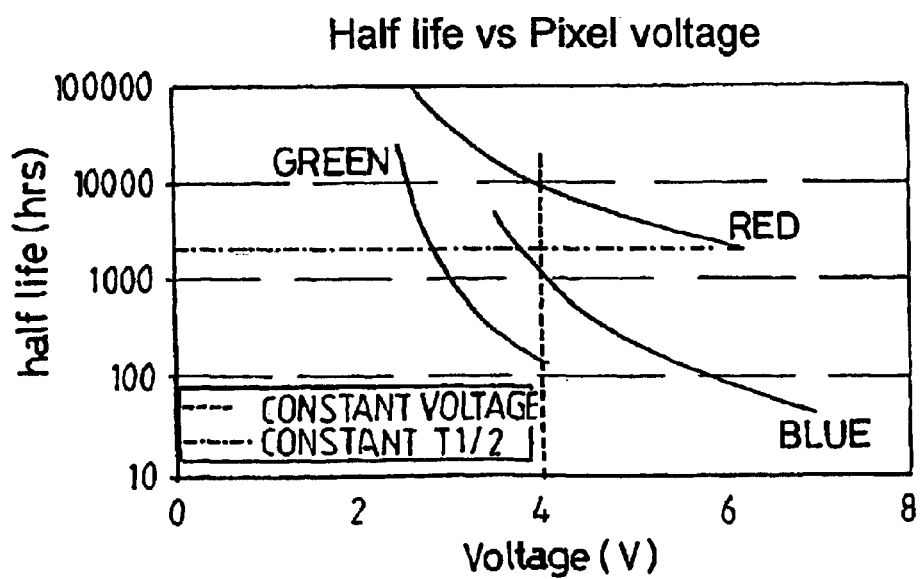
FIG. 8 is a graph showing half-life versus pixel voltage for the colours red, green and blue.

In some applications a different perceived luminance of the different pixel colours can be acceptable, e.g., in communication applications. The pixel area ratio cannot be used to equalise the half-lives at an identical pixel voltage, since with the, pixel area only the perceived luminance can be modified. However, the pulse width ratio can be used to allow identical pixel voltage and identical half lives for the different pixels. An equal voltage, e.g., 4V, for all the colours and an equal life time for these colours can be achieved by changing the pulse width. In this example, FIG. 8 gives the half-lives for the different colours at 4V as T1/2(red)=10000 hrs, T1/2(green)=120 hrs and T1/2 (blue)=1000 hrs. By choosing pulse widths inversely proportional to the half-lives, identical life times are attainable, i.e., width(red):width(green):width(blue)=1:0.012:0.1. The luminance of the pixels will not be equal and are in this example:

$$Lum(red) = 200*1 = 200 \text{ cd/m}^2;$$
$$Lum(green) = 4000*.0.012 = 48 \text{ cd/m}^2; \text{and}$$
$$Lum(blue) = 100*.0.1 = 10 \text{ cd/m}^2.$$

1.5 Different Luminance, Different Voltage, Optimal Efficiency, Equal Life-time.

Figure 9:
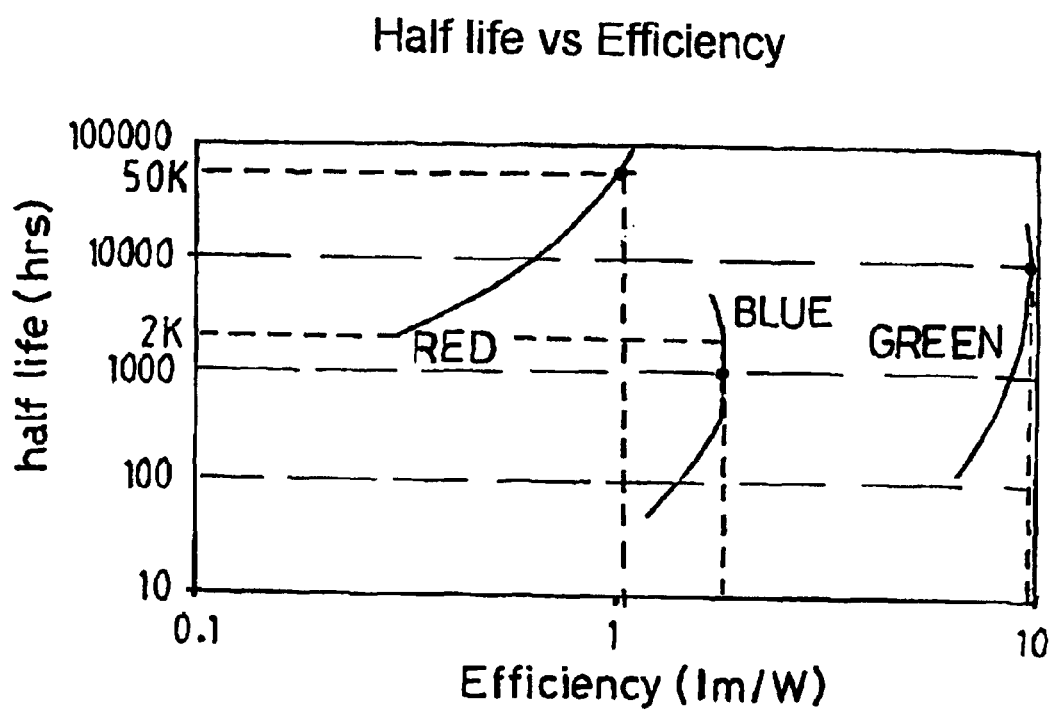
FIG. 9 is a graph showing half-life versus efficiency for the colours red, green and blue.

Another solution is to optimise the pulse width in order to achieve maximal efficiency for all the colours and an equal half-life for all the colours. From FIG. 9, it can be seen that operating at the optimal efficiency values (see FIG. 7) for red green and blue gives half-lives of 50,000 hrs, 10,000 hrs and 2,000 hrs respectively. In order to obtain equal life times the pixels can be pulse-driven, leading of course to different luminances. In this example a pulse width ratio of: width (red):width (green):width(blue)=1:0.2:0.04 will lead to an overall half life of 50,000 hrs, however the corresponding luminance values are:

$$Lum(red) = 40 \text{ cd/m}^2;$$
$$Lum(green) = 10 \text{ cd/m}^2; \text{and}$$
$$Lum(blue) = 2 \text{ cd/m}^2.$$

Figure 1:
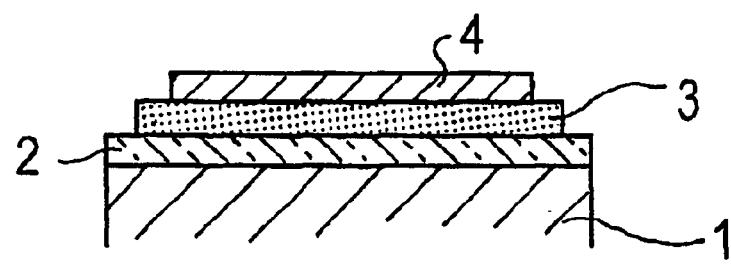
FIG. 1 is a schematic illustration of an organic light-emissive device known in the art.
Figure 10:
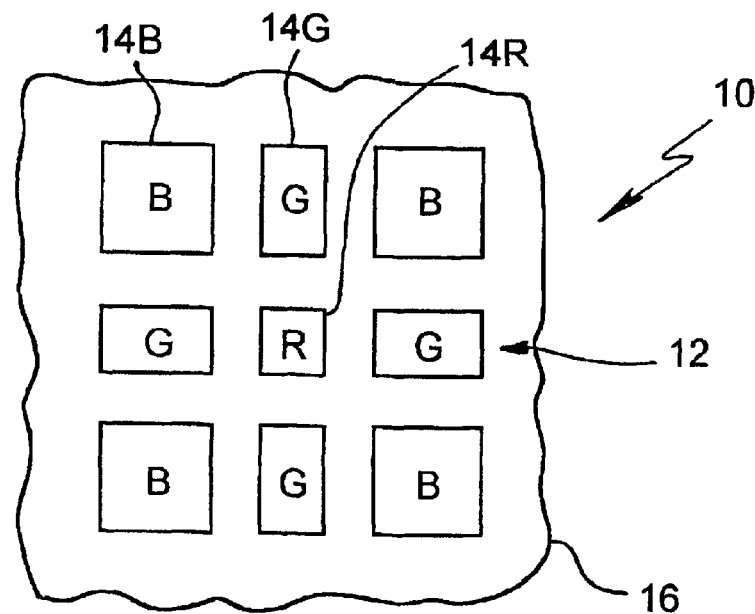
FIG. 10 is a schematic illustration of a graphic display embodying the present invention.
Figure 11:
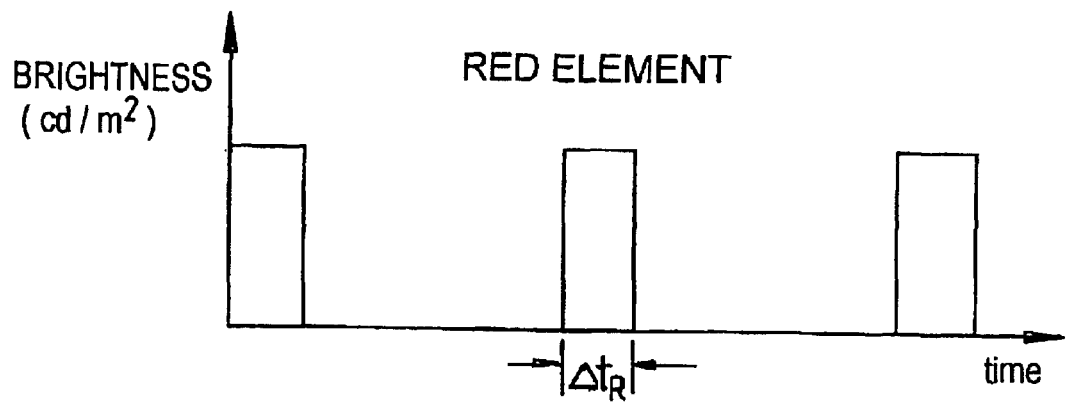
FIG. 11 shows pulse driving for "red" and "green" elements in FIG. 10.
Figure 11:
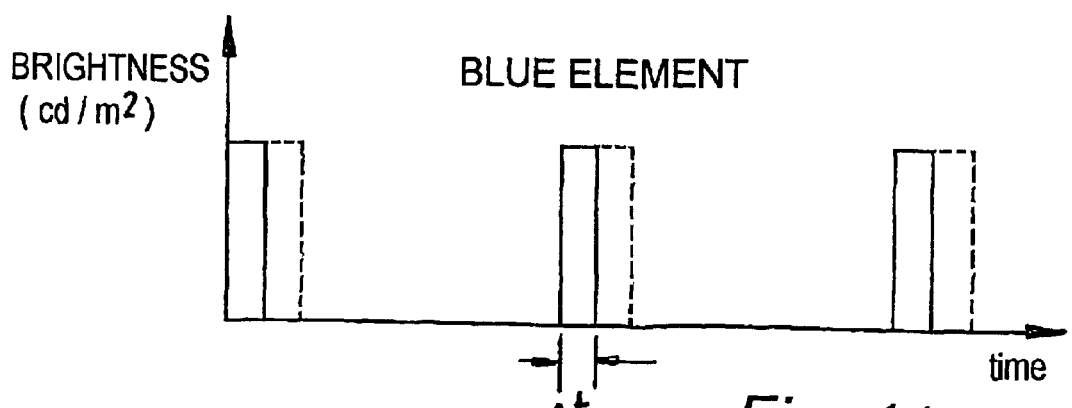
Figure 12:
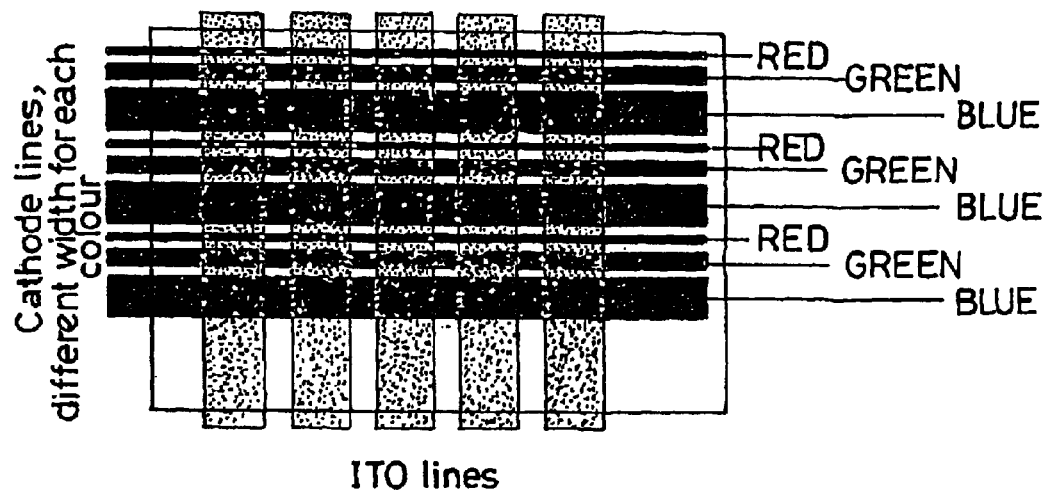
FIG. 12 shows schematically how different pixel areas can be achieved.
Figure 13:
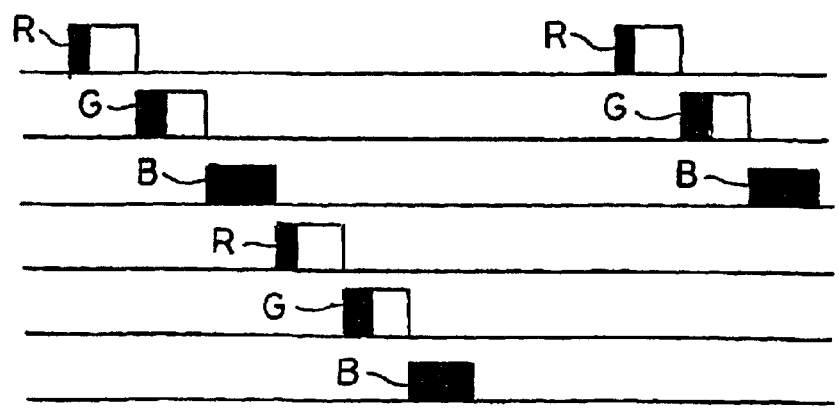
FIG. 13 shows a possible driving scheme providing different energy pulse widths to each pixel colour in FIG. 12.

FIG. 10 shows part of a graphic display 10 incorporating a light-emitting device 12 embodying at least one aspect of the present invention. The light-emitting device 12 includes polymer-based electroluminescent elements 14, a first (14R) of which is able to emit red light when energised, a second (14B) of which is able to emit blue light when energised, and a third (14G) of which is able to emit green light when energised. The elements 14 are mounted on a transparent substrate 16 coated with transparent electrodes (not shown) as in FIG. 1. The active lifetimes of and voltage drive characteristics for the three different elements are set out in Table 1.

The "red" element 14R is located centrally and the "green" and "blue" elements 14G,14B, are located symmetrically around it. Such peripheral elements of the same colour are operated as one thus ensuring the colour centroid is at the physical centre of the device. In this example, the ratio of the areas covered by each of the elements in the device 12 is approximately one-third red to one green to three blue. (The area of the green element is first selected, and then the areas of the red and blue elements are decreased and increased respectively although not necessarily optimised according to 1.1 or 1.2.). The different coloured elements in the device may be configured to operate at a common potential, or with different potentials. Taking each scenario in turn;

Common Potential

Figure 2:
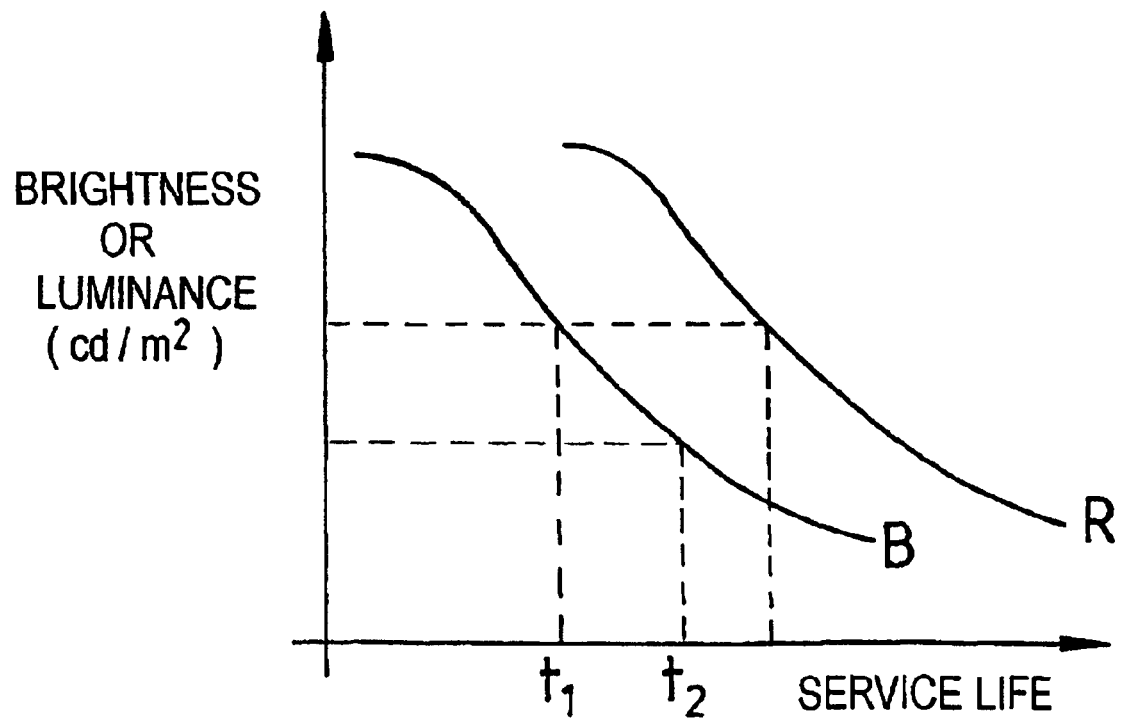
FIG. 2 is a schematic illustration showing how brightness affects the service life of the device of FIG. 1 operating under constant drive conditions.
Figure 3:
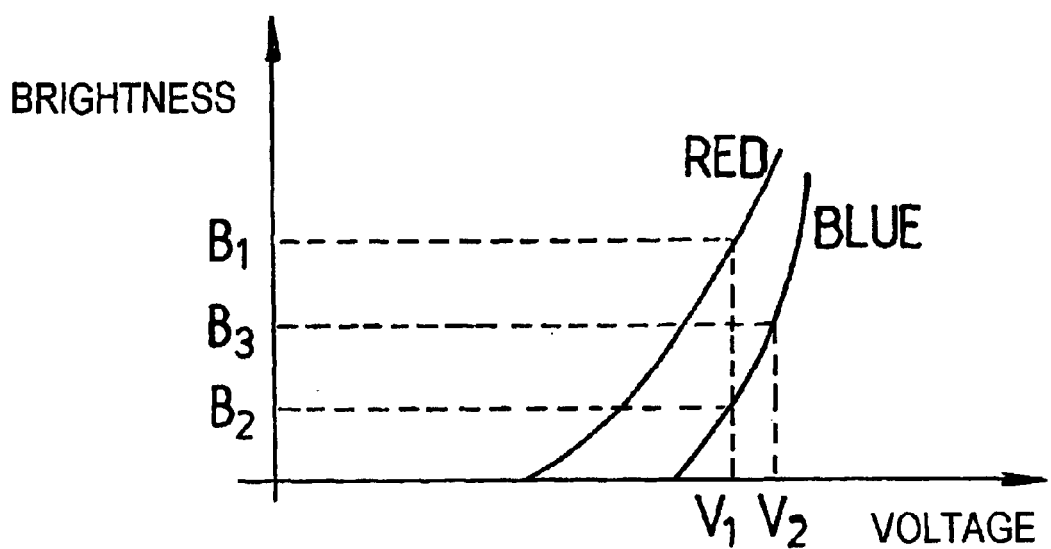
FIG. 3 is a schematic plot of brightness against voltage for two different electroluminescent elements.
Figure 4:
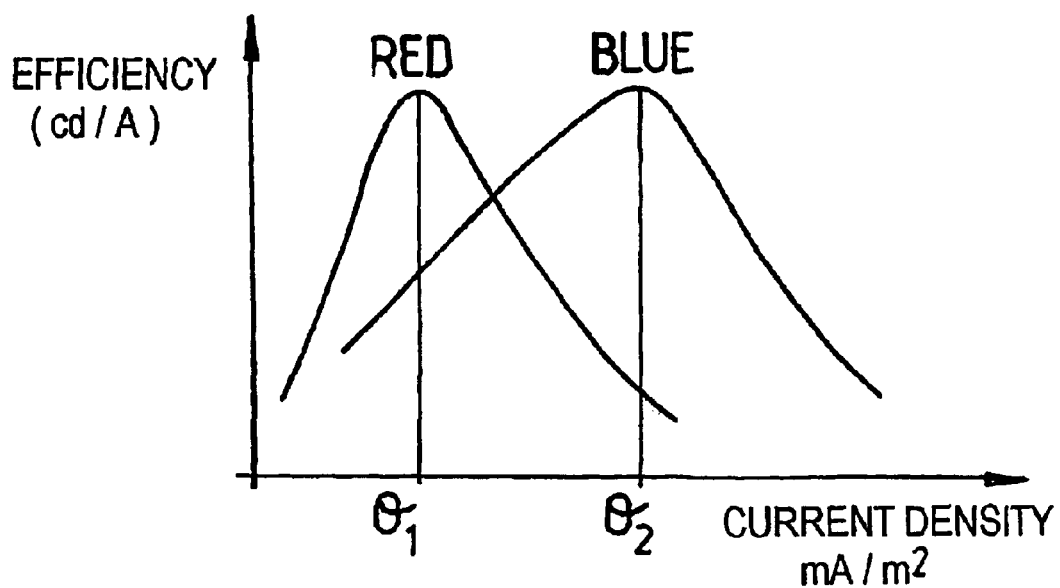
FIG. 4 is a schematic plot of efficiency against current density for the first and second elements.

At a common potential, (e.g. $V_1$) the brightness of light emitted from each element when energised will vary from colour to colour, being greatest for the red emitter and lowest for the blue emitters. This follows from FIG. 3 on the assumption that the "green" emitter falls in between the extremes set by the "red" and "blue" emitters. However, the amount of light produced of the three colours will be approximately equal since total light emission is also dependent on the area from which light is emitted. Achieving even light emission for each colour is desirable in graphic displays. The "common potential" approach achieves this by increasing the area of the element(s) with the lowest brightness relative to the area of the element with the highest brightness. This is quite distinct from the use of equal areas and achieving a balance in brightness by driving the "blue" element(s) at a higher potential than the "red" element. As shown in FIG. 2, the higher the brightness emitted by an organic electroluminescent element, the shorter the service life. Thus, by achieving a balance in light output using area compensation instead of voltage compensation, the "blue" element(s) may be operated at a lower brightness than the "red" element to increase service life (e.g. from $t_1$ to $t_2$ in FIG. 2).

Different Potential

In view of the disparity between voltage drive characteristics of the "red", "green" and "blue" elements (see FIG. 3), it may be desirable to drive the "blue" elements at a higher potential than the "red" and "green" elements. However, driving the "blue" elements at a higher potential would increase brightness, and would seem to reduce active lifetime and hence service life, rather than increase it. Thus, it is necessary to pulse the potential to the "blue" element such that even though producing an equivalent light output to the other elements, the actual time average brightness is lowered, thereby extending active lifetime. Of course, it would be possible to drive all elements with pulsed potentials, in which case the desired effect is achieved by pulsing different elements in different ways. For example, if pulsed with the same frequency, the pulse width may be greater for "red" elements than for the "blue" elements, as shown in FIG. 6. In this way, the service life of the graphic display may be increased from 1.5K hours to 4.5K hours; a three-fold improvement over the active lifetime of a blue element operated in the conventional way.

TABLE 1

|  | Active Lifetime | Vol.Drive Charact. |
| --- | --- | --- |
| Red Emitter | 30 K hours (good) | Low |
| Green Emitter | 10 K hours (moderate) | Low |
| Blue Emitter | 1.5 K hours (short) | High |

TABLE 2

|  | Equal Perceived Pixel Luminance | Half Life | Voltage/ current Pixel | Efficiency |
| --- | --- | --- | --- | --- |
| Equal Perceived pixel Luminance | X | Area 1.1 | Area, time 1.2 | Area, Time 1.3 |
| Half-Life |  | X | Time 1.4 | Time 1.5 |
| Voltage/current pixel |  |  | X | No solution |
| Efficiency |  |  |  | X |

What is claimed is:

1. A light-omitting device comprising: a first electroluminescent element for emitting light of a first colour when energised; and a second electroluminescent element for omitting light of a second colour when energized, the first electroluminescent clement having an active lifetime which a greater than that of the second electroluminescent element; characterised in that the second electroluminescent element is configured to operate at a lower brightness than the first electroluminescent element and in that the second electroluminescent element is adapted to emit light over a larger area than the first electroluminescent element.

2. A light-emitting device according to claim 1, in which the first or second electroluminescent elements comprise organic light emissive material.

3. A light-emitting device according to claim 2, in which the organic light emissive material is polymeric.

4. A light-emitting device according to claim 1, in which the first end second electroluminescent elements are energised by a common potential.

5. A light-emitting device according to claim 4, in which the common potential is applied through an electrode common to both elements.

6. A light-emitting device according to claim 5, in which the common potential is applied between an anode and a cathode common to both elements.

7. A light-emitting device according to claim 1, in which the first and second electroluminescent elements are energized by different potentials.

8. A light-emitting device according to claim 7, in which the second electroluminescent element is energized at a higher potential than the first electroluminescent element.

9. A light-emitting device according to claim 4, in which the potential applied to one or both of the electroluminescent elements is pulsed.

10. A light-emitting device according to claim 9, in which the first electroluminescent element is energised for longer periods than the second electroluminescent element.

11. A light-emitting device according to claim 10, in which the first electroluminescent element is pulsed more frequently or with a greater pulse width than the second electroluminescent element.

12. A light-emitting device according to claim 9, in which over a given period line ratio between energization times for the first and second electroluminescent elements is substantially equal to the ratio between the lifetimes of the second and first electroluminescent elements respectively.

13. A light-emitting device according to claim 1, in which the ratio between the light-emitting areas of the first and second electroluminescent elements is substantially equal to the ratio between the brightness of the second electroluminescent element and the brightness of the first electroluminescent element when energised for equal periods.

14. A light-emitting device according to claim 1, in which the first and second colours of light emission are selected from the group consisting of red, green and blue.

15. A light-emitting device according to claim 1, in which the ratio between the brightness of the first electroluminescent element and the brightness of the second electroluminescent element is substantially equal to the ratio between the active lifetime of the first electroluminescent element and the active lifetime of the second electroluminescent element.

16. A light-emitting device according to claim 1, further comprising a third electroluminescent element for emitting light of a third colour when energised, third electroluminescent element having an active lifetime in between that of the first and second electroluminescent elements.

17. A light-emitting device according to claim 16, in which the third electroluminescent element is energised by the same potential as the first electroluminescent element.

18. A light-emitting device according to claim 16, in which the third electroluminescent element is adapted to emit light over an area which is greater than that of the first electroluminescent element but less than that of the second electroluminescent element.

19. A graphic display comprising a light emitting device according claim 1, wherein each electroluminescent element corresponds to a pixel for displaying graphic information.

\* \* \* \* \*